United States Patent [19]
Baron et al.

[11] Patent Number: 5,327,103
[45] Date of Patent: Jul. 5, 1994

[54] LOCK DETECTION CIRCUIT FOR A PHASE LOCK LOOP

[75] Inventors: Nathan Baron, Oranit; Judah Adelman, Jerusalem; Yehuda Volpert, Petach Tikva, all of Israel

[73] Assignee: Motorola, Inc., Schaumburg, Ill.

[21] Appl. No.: 86,263

[22] Filed: Jun. 29, 1993

[30] Foreign Application Priority Data

Jul. 2, 1992 [GB] United Kingdom ............... 9214181

[51] Int. Cl.$^5$ .......................................... H03L 7/095
[52] U.S. Cl. ...................... 331/1 A; 331/25; 331/DIG. 2
[58] Field of Search ............. 331/1 A, 25, DIG. 2

[56] References Cited
U.S. PATENT DOCUMENTS 4,122,405 10/1978 Tietz et al. ............... 331/1 A
4,617,520 10/1986 Levine .................... 331/25 X
5,008,635 4/1991 Hanke et al. .............. 331/1 A

*Primary Examiner*—Siegfried H. Grimm
*Attorney, Agent, or Firm*—Michael D. Bingham; Harry A. Wolin

[57] ABSTRACT

A lock detection circuit (2) for a phase lock loop (PLL) for detecting when a signal generated by the PLL is substantially locked to a reference signal (REFERENCE). The lock detection circuit includes a circuit for generating first (UP) and second (DOWN) pulses, the first and second pulses respectively representing positive and negative differences between a parameter, such as phase, of the PLL signal and a parameter of the reference signal, and a first counter (4) for counting sets of first and second, pulses, each set comprising a first pulse followed by a second pulse, the first counter on counting a predetermined number of sets of pulses providing a first count complete signal. The lock detection circuit further includes a second counter (6) for counting transitions of the reference signal (REFERENCE), and being coupled to the circuit for generating whereby the second counter is reset by the first (UP) or second (DOWN)pulse, the second counter (6) on counting a predetermined number of transitions of the reference signal providing a second count complete signal, and a logic circuit (20) for generating a signal (LOCK) indicating lock has been achieved in response to the receipt of either the first or second count complete signal. Preferably, the lock detection circuit further includes a pulse width detection circuit (30) for detecting the widths of the first and second pulses and in response to detecting the width of either of the first or second pulse is greater than a predetermined value for providing a reset signal which resets the first and second counter.

15 Claims, 2 Drawing Sheets

LOCK DETECTION CIRCUIT FOR A PHASE LOCK LOOP

This invention relates to a lock detection circuit for a phase lock loop (PLL).

BACKGROUND OF THE INVENTION

Phase lock loops (PLLs) are well known in the field of electronics. Their function is to provide an output signal which is locked to the frequency of an input signal. Such 'locking' is achieved by using amongst other things a phase detector which compares the phase of the input signal with that of the signal generated by the PLL.

U.S. Pat. No. 4,771,249 discloses a PLL circuit comprising a phase detector having fast start up capability and stable operating characteristics. In this circuit, a reference clock is compared with a clock generated by the PLL. Control signals are generated by the phase detector having a pulse width proportional to the phase difference between the two clocks. If a falling edge of the reference clock precedes the PLL generated clock, a signal UP is generated. The UP signal is negated by a falling edge of the PLL generated clock. If a falling edge of the PLL generated clock precedes the reference clock, a signal DOWN is generated. The DOWN signal is negated by a falling edge of the reference clock.

Each time an UP signal is generated, an input signal COUNT of a T-type flip-flop is set. Each time a DOWN signal is generated, the signal COUNT is reset. A counter which counts up to a predetermined number of UP-DOWN transitions is formed by coupling a plurality of these T-type flip-flops together, the predetermined number of transitions depending on the number of flip-flops used. If there is a very large frequency shift between the reference clock and the PLL generated clock, the counter is reset. Once the counter reaches the predetermined count, it is assumed that lock has been achieved. A LOCK signal is then asserted and the chip incorporating the PLL commences normal operation.

Fig. 1 shows how the frequency of a PLL generated signal changes as the PLL attempts to lock to the reference signal for an overdamped loop and an underdamped loop. Curve A represents an underdamped loop and curve B represents an overdamped loop.

For the underdamped loop (curve A), the PLL counter counts the UP-DOWN transitions. If the count is completed at time X, then the asserted LOCK signal correctly indicates that lock has been achieved. However, if the count is completed at time Y, the loop is not locked and the asserted LOCK signal falsely indicates that lock has been achieved. Thus, for severely underdamped loops, the prior art PLL suffers from a problem of inaccurate lock detection.

For the overdamped loop (curve B), no UP-DOWN transitions occur so that the prior art PLL circuit cannot detect lock for a PLL in this state. In loops that are overdamped, it has been difficult devising a mechanism that detects the lock state in a timely and reliable manner. In extremely overdamped PLLs, lock notification does not occur so that chips with overdamped PLLs are normally discarded as faulty.

The prior art PLL circuits also suffer from problems arising during the locking process due to production tolerances. The production tolerances cannot be controlled by the chip designer.

There is therefore a significant need for a PLL which can detect lock for both overdamped and underdamped states and can operate in an optimal fashion irrespective of process variations and tolerances.

SUMMARY OF THE INVENTION

In accordance with the present invention there is provided a lock detection circuit for a phase lock loop (PLL) for detecting when a signal generated by the PLL is substantially locked to a reference signal, the lock detection circuit comprising:

means for generating first and second pulses, the first and second pulses respectively representing positive and negative differences between a parameter of the PLL signal and a parameter of the reference signal;

first counting means for counting sets of first and second pulses, each set comprising a first pulse followed by a second pulse, the first counting means on counting a predetermined number of sets of pulses providing a first count complete signal, the lock detection circuit being characterised by:

second counting means for counting transitions of the reference signal, and being coupled to the means for generating whereby the second counting means is reset by the first or second pulses, the second counting means on counting a predetermined number of transitions of the reference signal providing a second count complete signal; and logic means for generating a signal indicating lock has been achieved in response to the receipt of either the first or second count complete signal.

The lock detection circuit in accordance with the present invention therefore indicates lock has been achieved when either the first or second counting means reaches its predetermined count. The first counting means counts the sets of first (UP) and second (DOWN) pulses and the second counting means counts the transitions of the reference signal. Thus, irrespective of whether the UP and DOWN signals are generated or not, the lock detection circuit in accordance with the invention can detect lock and therefore can detect lock for both overdamped and underdamped states.

In a preferred arrangement, the lock detection circuit further comprises a pulse width detection circuit for detecting the widths of the first and second pulses and in response to detecting the width of either of the first or second pulse is greater than a predetermined value for providing a reset signal which resets the first and second counting means.

In loops that are severely underdamped, the PLL may indicate that lock has been achieved before it has actually occurred. This will cause the chip to commence operation with an unstable clock. By ensuring that the counters do not begin counting until the phase difference between the PLL generated signal and the reference signal is less than a predetermined value, the pulse width detection circuit overcomes this problem.

With some PLLs, skew elimination is an important issue: it is critical to commence normal chip operation only when the skew between the phases of the PLL clock input and the reference clock is smaller than a pre-determined value. None of the prior art circuits can guarantee skew has been eliminated. The pulse width detection circuit however ensures that skew is eliminated.

A further advantage of the pulse width detection circuit is it ensures that sporadic UP or DOWN signals do not cause premature notification that the lock state has been achieved.

The pulse width detection circuit may be used with the UP/DOWN pulse counter only. Such use of the pulse width detection circuit would have the same advantages as outlined above.

BRIEF DESCRIPTION OF THE DRAWINGS

A lock detection circuit in accordance with the present invention will now be described, by way of example only, with reference to the accompanying drawings in which.

DETAILED DESCRIPTION OF THE PREFERRED EMBODIMENT

The operation of the prior art phase detector and the generation of the UP-DOWN signals is described in detail in U.S. Pat. No. 4,771,249, the disclosure of which is incorporated herein by reference. Briefly stated, circuitry (not shown) detects when the PLL output phase overshoots and undershoots the reference frequency and in response thereto asserts an overshot signal DOWN and an undershot signal UP respectively.

Figure 1:
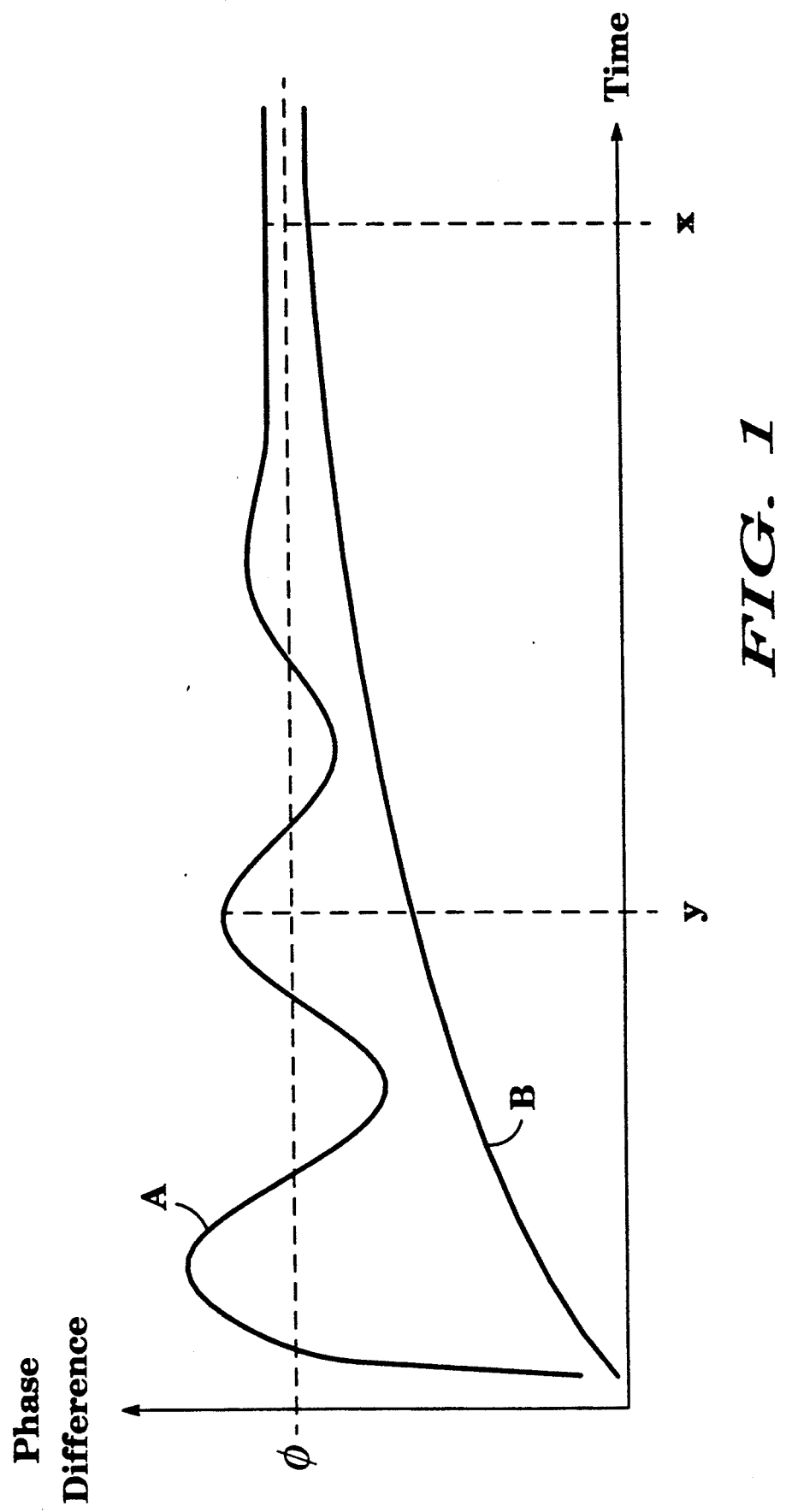
FIG. 1 is a diagrammatic representation of the relationship between phase and time for overdamped and underdamped loops.
Figure 2:
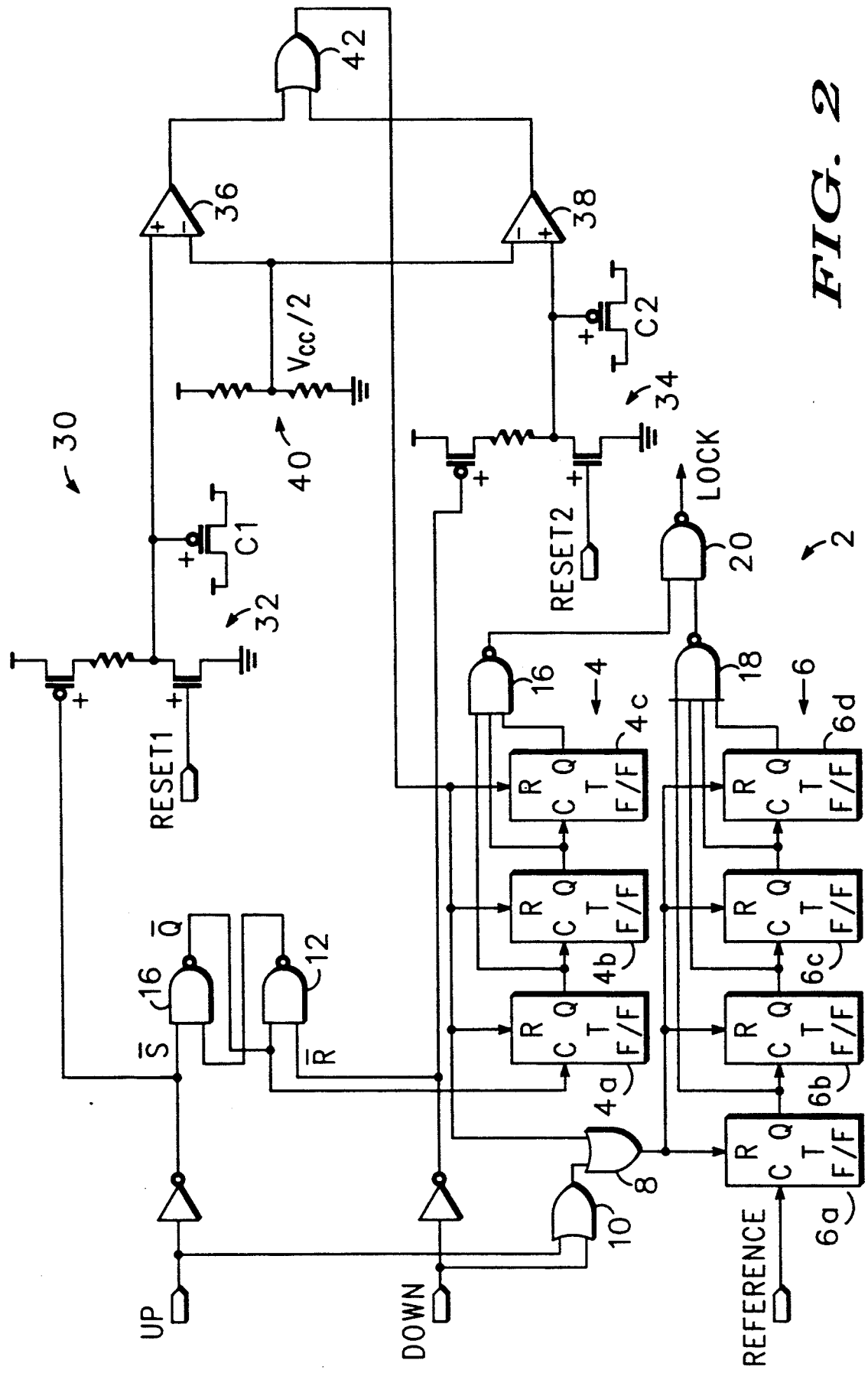
FIG. 2 is a schematic diagram of a lock detection circuit in accordance with the present invention.

Referring to FIG. 2, a lock detection circuit 2 in accordance with a preferred embodiment of the present invention for use with a phase detector (not shown) of a PLL comprises a first counter 4 and a second counter 6 both coupled to receive the UP and DOWN signals generated by the phase detector.

The first counter 4 in the preferred embodiment is a three-bit counter comprising three toggle flip-flops 4a–4c. A reset input R of each of the three flip-flops 4a–4c is coupled to a first input of a first OR gate 8. The second input of the first OR gate 8 is coupled to the output of a second OR gate 10. A first input of the second OR gate 10 receives the UP signal and a second input of the second OR gate 10 receives the DOWN signal. A clock input C of the first 4a of the three flip-flops is coupled to a first input of a first NAND gate 12 which is also coupled to the output of a second NAND gate 14. The second input of the first NAND gate 12 receives the inverse of the DOWN signal $\overline{DOWN}$ and the output of the first NAND gate 12 is coupled to a first input of the second NAND gate 14. The second input of the second NAND gate 14 receives the inverse of the UP signal $\overline{UP}$. The first and second NAND gates 12 and 14 form a set/reset flip-flop: the second NAND gate 14 is the set device and the first NAND gate 12 is the reset device. An output Q of the first flip-flop 4a is coupled to a clock input C of the second 4b of the three flip-flops and to a first input of a NAND gate 16. An output Q of the second flip-flop 4b is coupled to a clock input C of the third flip-flop 4c and to a second input of the NAND gate 16. An output Q of the third flip-flop 4 c is coupled to a third input of the NAND gate 16.

The second counter 6 in the preferred embodiment is a four-bit counter comprising four toggle flip-flops 6a–d. A reset input R of each of the four flip-flops 6a–d is coupled to an output of the first OR gate 8. A clock input C of the first 6a of the four flip-flops receives the reference clock signal REFERENCE. An output Q of the first flip-flop 6a is coupled to a clock input C of the second flip-flop 6b and to a first input of a NAND gate 18. An output Q of the second flip-flop 6b is coupled to a clock input C of the third flip-flop 6c and to a second input of the NAND gate 18. An output Q of the third flip-flop 6c is coupled to a clock input C of the fourth flip-flop 6d and to a third input of NAND gate 18. An output Q of the fourth flip-flop 6d is coupled to a fourth input of NAND gate 18. The outputs of NAND gate 18 and NAND gate 16 are coupled to respective first and second inputs of NAND gate 20. The output of NAND gate 20 provides the LOCK signal.

Preferably, the lock detection circuit 2 further comprises a detection circuit 30 for detecting whether the pulse width of the UP or DOWN signals is greater than a predetermined value. In the preferred embodiment the predetermined value is 2 ns. If the pulse width of the UP or DOWN signal is greater than 2 ns, then both the first 4 and second 6 counters are reset.

The pulse width detection circuit 30 comprises a first RC circuit 32 coupled to receive the inverse of the UP signal and a second RC circuit 34 coupled to receive the inverse of the DOWN signal. The first RC circuit is coupled to a first input of a first comparator 36 and the second RC circuit is coupled to a first input of a second comparator 38. The second inputs of the first 36 and second 38 comparators receive a reference voltage provided by a voltage divider 40. The outputs of the first 36 and second 38 comparators are respectively coupled to first and second inputs of an OR gate 42. The output of OR gate 42 is coupled to the reset inputs R of the three flip-flops 4a–4c and to the first input of the first OR gate 8. The first 32 and second 34 RC circuits are reset via RESET1 and RESET2.

The operation of the lock detection circuit 2 in accordance with the invention is as follows.

The first counter 4 is incremented for each UP-DOWN transition detected by way of the UP and DOWN signals from the phase detector. After seven transitions have been counted, the output of NAND gate 16 switches from a logic high to a logic low and the lock signal LOCK is generated via NAND gate 20. The operation of the first counter 4 is similar to that of the prior art counter.

The second counter 6 is incremented on each negative edge of the reference signal and so independently from the UP and DOWN signals. The second counter 6 is reset if either of the UP or DOWN signals are asserted via the OR gates 8 and 10. If the second counter counts 15 negative edges of the reference signal without being reset, the output of the NAND gate 18 switches from a logic high to a logic low and the lock signal LOCK is generated via NAND gate 20.

Thus, the LOCK signal is the logical NAND of the completion of the count of either of the first and second counters.

Since the second counter is incremented by the reference signal and not by the UP/DOWN signals, the LOCK signal will be asserted even in the cases of critical damping or overdamping or once the clocks are very close to each other when in each of these cases no UP/DOWN signals are generated.

The operation of the pulse width detection circuit 30 will now be described.

The UP and DOWN signals charge their respective RC circuits 32 and 34. The voltage on the charged capacitors C1 and C2 are compared with a reference voltage which is typically equal to $V_{CC}/2$. If the UP or DOWN signal is a pulse having a width greater than the predetermined value of 2 ns, the voltage on the charged capacitor is greater than the reference voltage $V_{CC}/2$ and the output of the OR gate 42 resets the first and second counters 4 and 6. Thus, the counters 4, 6 do not begin counting to determine that lock has been achieved until the difference between the PLL generated clock and the reference clock is less than 2ns. This means that lock will be achieved when the discrepancy between the two clocks is substantially lower than 2 ns. Thus, the exact detection level of the pulse width detection circuit 30 is immaterial and proper operation over a wide range of production variations is assured. This is particularly useful for PLLs that have stringent skew elimination requirements. The first 32 and second 34 RC circuits are reset via RESET 1 and RESET 2 once the first and second counters have been reset.

In summary, the present invention provides a lock detection circuit comprising two counters: a first counter clocked by the UP/DOWN signals which represent the phase difference between the PLL generated signal and the reference signal and a second counter clocked by the reference signal. The lock detection circuit is arranged to indicate that lock has been achieved once the count of either one of the two counters has been completed. Thus, the lock detection circuit in accordance with the present invention can detect lock for both underdamped and overdamped states and when the PLL generated signal is very close to the reference signal.

In a preferred embodiment, the lock detection circuit further comprises a RC pulse width detection circuit for skew detection. The circuit detects when the difference between the PLL generated clock and the reference clock is greater than a predetermined value and in response thereto resets both the counters. This is important for PLL's where skew elimination is a critical parameter.

We claim:

1. A lock detection circuit for a phase lock loop (PLL) for detecting when a signal generated by the PLL is substantially locked to a reference signal, the lock detection circuit comprising:
   means for generating first and second pulses, the first and second pulses respectively representing positive and negative differences between a parameter of the PLL signal and a parameter of the reference signal; p1 first counting means for counting sets of the first and second pulses, each set comprising a first pulse followed by a second pulse, the first counting means on counting a predetermined number of sets of pulses providing a first count complete signal, the lock detection circuit being characterised by:
   second counting means for counting transitions of the reference signal, and being coupled to the means for generating whereby the second counting means is reset by the first or second pulses, the second counting means on counting a predetermined number of transitions of the reference signal providing a second count complete signal; and
   logic means for generating a signal indicating lock has been achieved in response to the receipt of either the first or second count complete signal.

2. The lock detection circuit according to claim 1 wherein the second counting means counts the failing transitions of the reference signal.

3. The lock detection circuit according to claim 1 wherein the second counter is a m-bit counter comprising m toggle flip-flops coupled in series, a clock input of the first toggle flip-flop being coupled to receive the reference signal, the reset inputs of each of the m toggle flip-flops being coupled to receive the first and second pulses, the output of the first toggle flip-flop and each following flip-flop being coupled to a clock input of the following toggle flip-flip and to a respective input of a NAND logic gate whereby on counting $2^m - 1$ transitions of the reference signal the output of the NAND logic gate switches states and thereby provides the second count complete signal.

4. The lock detection circuit according to claim 1 further comprising a pulse width detection circuit for detecting the widths of the first and second pulses and in response to detecting the width of either of the first or second pulse is greater than a predetermined value for providing a reset signal which resets the first and second counting means.

5. The lock detection circuit according to claim 4 wherein the pulse width detection circuit comprises:
   a first RC circuit coupled to the means for generating whereby the first RC circuit is charged to a first voltage level by the first pulse, the first voltage level being dependent on the width of the first pulse;
   a second RC circuit coupled to the means for generating whereby the second RC circuit is charged to a second voltage level by the second pulse, the second voltage level being dependent on the width of the second pulse; and
   comparing means for comparing the first voltage level and the second voltage level with a reference voltage and for providing the reset signal if either the first voltage level or the second voltage level is greater than the reference voltage.

6. The lock detection circuit according to claim 5 wherein the comparing means comprises:
   a first comparator for comparing the first voltage level with the reference voltage and for providing a first output signal having a first or second state, the first output signal having the first state if the first voltage level is greater than the reference voltage;
   a second comparator for comparing the second voltage level with the reference voltage and for providing a second output signal having the first or second state, the second output signal having the first state if the second voltage level is greater than the reference voltage level; and
   an OR logic gate coupled to receive the first and second output signals at first and second inputs thereof for providing the reset signal in response to the first or second output signal having the first state.

7. The lock detection circuit according to claim 5 wherein the pulse width detection circuit further comprises a voltage divider for providing the reference voltage.

8. A lock detection circuit for a phase lock loop (PLL) for detecting when a signal generated by the PLL is substantially locked to a reference signal, the lock detection circuit comprising:
   means for generating first and second pulses, the first and second pulses respectively representing positive and negative differences between a parameter of the PLL signal and a parameter of the reference signal;
   first counting means for counting sets of the first and second pulses, each set comprising a first pulse followed by a second pulse, the first counting means on counting a predetermined number of sets of pulses providing a first count complete signal, the lock detection circuit being characterised by:

second counting means for counting transitions of the reference signal, and being coupled to the means for generating whereby the second counting means is reset by the first or second pulses, the second counting means on counting a predetermined number of transitions of the reference signal providing a second count complete signal;

logic means for generating a signal indicating lock has been achieved in response to the receipt of either the first or second count complete signal; and a pulse width detection circuit for detecting the widths of the first and second pulses and in response to detecting the width of either of the first or second pulse is greater than a predetermined value for providing a reset signal which resets the first and second counting means.

9. The lock detection circuit according to claim 8 wherein the pulse width detection circuit comprises:

a first RC circuit coupled to the means for generating whereby the first RC circuit is charged to a first voltage level by the first pulse, the first voltage level being dependent on the width of the first pulse;

a second RC circuit coupled to the means for generating whereby the second RC circuit is charged to a second voltage level by the second pulse, the second voltage level being dependent on the width of the second pulse; and comparing means for comparing the first voltage level and the second voltage level with a reference voltage and for providing the reset signal if either the first voltage level or the second voltage level is greater than the reference voltage.

10. The lock detection circuit according to claim 9 wherein the comparing means comprises:

a first comparator for comparing the first voltage level with the reference voltage and for providing a first output signal having a first or second state, the first output signal having the first state if the first voltage level is greater than the reference voltage;

a second comparator for comparing the second voltage level with the reference voltage and for providing a second output signal having the first or second state, the second output signal having the first state if the second voltage level is greater than the reference voltage level; and an OR logic gate coupled to receive the first and second output signals at first and second inputs thereof for providing the reset signal in response to the first or second output signal having the first state.

11. A lock detection circuit for a phase lock loop (PLL) for detecting when a signal generated by the PLL is substantially locked to a reference signal, the lock detection circuit comprising:

means for generating first and second pulses, the first and second pulses respectively representing positive and negative differences between a parameter of the PLL signal and a parameter of the reference signal;

first counting means for counting the first and second pulses, the first counting means on counting a predetermined number of pulses providing a signal indicating lock has been achieved, the lock detection circuit being characterised by:

a pulse width detection circuit for detecting the widths of the first and second pulses and in response to detecting the width of either of the first or second pulse is greater than a predetermined value for providing a reset signal which resets the first counting means.

12. The lock detection circuit according to claim 11 wherein the first counting means counts sets of the first a second pulses, each set comprising a first pulse followed by a second pulse, the first counting means providing the first count complete signal in response to counting a predetermined number of sets of pulses.

13. The lock detection circuit according to claim 11 wherein the pulse width detection circuit comprises:

a first RC circuit coupled to the means for generating whereby the first RC circuit is charged to a first voltage level by the first pulse, the first voltage level being dependent on the width of the first pulse;

a second RC circuit coupled to the means for generating whereby the second RC circuit is charged to a second voltage level by the second pulse, the second voltage level being dependent on the width of the second pulse; and comparing means for comparing the first voltage level and the second voltage level with a reference voltage and for providing the reset signal if either the first voltage level or the second voltage level is greater than the reference voltage.

14. The lock detection circuit according to claim 13 wherein the comparing means comprises:

a first comparator for comparing the first voltage level with the reference voltage and for providing a first output signal having a first or second state, the first output signal having the first state if the first voltage level is greater than the reference voltage;

a second comparator for comparing the second voltage level with the reference voltage and for providing a second output signal having the first or second state, the second output signal having the first state if the second voltage level is greater than the reference voltage level; and an OR logic gate coupled to receive the first and second output signals at first and second inputs thereof for providing the reset signal in response to the first or second output signal having the first state.

15. A phase lock loop comprising a lock detection circuit according to claim 1.

* * * * *

UNITED STATES PATENT AND TRADEMARK OFFICE
CERTIFICATE OF CORRECTION

PATENT NO. : 5,327,103
DATED : July 5, 1994
INVENTOR(S) : Nathan Baron et al.

It is certified that error appears in the above-indentified patent and that said Letters Patent is hereby corrected as shown below:

In column 5, line 46, claim 1, delete "p1", and "first counting means for counting set of " should start a new paragraph.

Signed and Sealed this

Fourth Day of July, 1995

*Attest:*

BRUCE LEHMAN

*Attesting Officer*     *Commissioner of Patents and Trademarks*